US007834780B2

(12) United States Patent
Sullivan et al.

(10) Patent No.: US 7,834,780 B2
(45) Date of Patent: Nov. 16, 2010

(54) WAVEFORM COMPRESSION AND DISPLAY

(75) Inventors: Steven K. Sullivan, Beaverton, OR (US); Paul M. Gerlach, Beaverton, OR (US); Kristie Veith, Portland, OR (US); Kenneth P. Dobyns, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 1246 days.

(21) Appl. No.: 11/385,170

(22) Filed: Mar. 20, 2006

(65) Prior Publication Data

US 2007/0217694 A1 Sep. 20, 2007

(51) Int. Cl.
*H03M 7/00* (2006.01)

(52) U.S. Cl. ......................................................... 341/61
(58) Field of Classification Search .................... 341/61, 341/155, 159, 122; 345/208, 440, 691
See application file for complete search history.

(56) References Cited

U.S. PATENT DOCUMENTS

| | | | |
|---|---|---|---|
| 4,183,087 A | | 1/1980 | Huelsman |
| 4,271,486 A | | 6/1981 | Dagostino |
| 4,586,022 A | | 4/1986 | Acuff |
| 4,621,217 A | | 11/1986 | Saxe |
| 5,115,189 A | | 5/1992 | Holcomb |
| 5,115,404 A | | 5/1992 | Lo |
| 5,119,426 A | * | 6/1992 | Roberts ........................ 381/56 |
| 5,233,546 A | | 8/1993 | Witte |
| 5,547,232 A | | 8/1996 | Waterman |
| 5,591,911 A | * | 1/1997 | Masuzawa et al. ............ 73/602 |
| 5,740,064 A | | 4/1998 | Witte |
| 6,121,799 A | | 9/2000 | Moser |
| 6,344,844 B1 | * | 2/2002 | Timm et al. ............... 345/440.1 |
| 6,388,595 B1 | | 5/2002 | Edwards |
| 6,861,841 B2 | * | 3/2005 | Raichle et al. .............. 324/379 |

OTHER PUBLICATIONS

E.B. Hogenauer, "An economical class of digital filters for decimation and interpolation." IEEE Transactions on Acoustics, Speech and Signal Processing, ASSP-29 (2) :155-162, 1981.
Matthew P. Donadio, "CIC Filter Introduction", For Free Publication by Iowegian, pp. 1-6, Jul. 18, 2000. Online at: http://users.snip.net/~donadio/cic.pdf.

* cited by examiner

*Primary Examiner*—Brian Young
(74) *Attorney, Agent, or Firm*—Francis I. Gray; Thomas F. Lenihan

(57) ABSTRACT

A waveform compression and display technique saves both a peak detected version (background version) and a decimated/lowpass filtered version (foreground version) of a sampled electrical signal. The two versions are displayed simultaneously overlaid together in a contrasting manner so as not to obscure information contained in either of them. The lowpass filtered version uses a series of simple lowpass filters with decimation to produce a single data stream from a plurality of data streams derived from the sampled electrical signal. The single data stream may then be subjected to additional filtering, such as a cascaded integrator-comb filter, to obtain a desired frequency bandwidth. When displayed, the peak detect pixels adjacent the decimated/lowpass filtered pixels may be adjusted in intensity so that the low frequency information of the lowpass filtered waveform is not lost, while the peak detect pixels further from the lowpass filtered pixels are intensified to highlight the high frequency information. Alternatively the background version intensity may be controlled by a user control over a first range from zero to a predetermined maximum, and the foreground version may be controlled over a second range from a default intensity to a maximum, saturated intensity.

41 Claims, 9 Drawing Sheets

WAVEFORM COMPRESSION AND DISPLAY

BACKGROUND OF THE INVENTION

The present invention relates to electrical signal waveform measurement and display, and more particularly to a method of waveform compression and display.

In digital oscilloscopes waveform data is sampled rapidly and stored in a memory. When observing long periods of time, the quantity of data may exceed the memory available. When this happens some information needs to be discarded. Therefore the sampled data needs to be compressed before being stored in the memory. Usable compression schemes are limited because the data arrives at a very high rate. The most common compression schemes are:

Decimation. This compression scheme aliases high frequency information and misses narrow pulses.

Peak Detection. In the presence of high frequency signals the low frequency information is lost.

HiRes Filtering. Some high frequency information is aliased and narrow pulses are filtered out.

Each of these schemes has serious drawbacks, as described in more detail below.

In digital oscilloscopes it is desirable to examine high frequency signals. To do this in real time the sample rate has to be twice the highest frequency components of the signal being examined. This is accomplished by using very fast technology to make the analog-to-digital converters (ADCs) and then placing many of these ADCs in parallel, digitizing the same analog input channel in such a way that each ADC digitizes data from a different time for each sample clock period. A very high sample rate is achieved, but this creates the problem of how to manage the vast amount of data that is generated in very short periods of time.

The sampled data typically is written into very fast memories with as many memories placed in parallel as needed. This works as long as the period of time being examined is short and the amount of data fits within the memory depth. However oscilloscope users want to examine electrical signals over long periods of time and, no matter how large the memory depth, the amount of data vastly exceeds the memory depth. In order to allow long periods of time to be examined, a compression scheme is needed to reduce the amount of data being stored in memory. The compression scheme has to be capable of very large compression ratios when very long periods of time are examined. The compression scheme also has to be very fast since data is arriving from the ADCs at such a high rate.

Decimation is the simplest form of compression. To compress by a factor of ten, just discard nine out of every ten samples. However decimation is not a very good compression scheme since, for example, narrow pulses that may be very important are often discarded. Also high frequency signal components are aliased to low frequencies. This may obscure important low frequency information. It also makes this form of compression "dishonest" because the low frequency signals seen may not really be there. U.S. Pat. No. 5,115,189 entitled "Anti-Aliasing Dithering Method and Apparatus for Low Frequency Signal Sampling" describes a method of keeping stable high frequency components from appearing as aliased low frequency signals by, when decimating by N, selecting one sample to be retained from each group of N samples on a random basis. The high frequency components still are aliased to low frequencies, but the steady high frequency signal is aliased to many low frequencies by this frequency modulating of the sample rate. U.S. Pat. No. 6,388,595 entitled "Dithering Apparatus to Properly Represent Aliased Signals for High Speed Signal Sampling" covers the same scheme, but with an implementation variation.

Another variation of decimation is shown in U.S. Pat. No. 4,586,022 entitled "Waveform Memory Circuit" where sampled data is compared with the last value stored in memory. When the difference between the two samples exceeds a limit, the new value together with the number of samples that were decimated is then stored into memory. With this technique signals that are principally composed of low frequency components have a much higher compression ratio than signals that have high frequency components. However this does not work well in general purpose digital oscilloscopes since all signals, even signals having high frequency components, need to be compressed in order to fit within the memory depth.

Peak detection involves dividing time into many equal periods and then finding the maximum signal voltage and the minimum signal voltage within each period of time. Originally analog circuitry was used to find the maximum and minimum voltages. These voltages are digitized and stored in memory. More recently the digital signal is examined with digital peak detecting circuitry to achieve the same result. Analog peak detectors always introduced errors, while digital peak detectors may fail to register the peak voltage if the signal is not sampled exactly at the peak. This latter problem becomes small when the sample rate is much higher than the highest frequency components of the signal. Although peak detection may be considered an "honest" way of displaying the analog signal, it tends to make signals look noisy since it displays the peak noise. Also when high frequency components are present they tend to obscure the low frequency components.

Normally both the maximum and minimum values are written into memory during each time interval. However U.S. Pat. No. 4,183,087 entitled "Peak Deviation Sampling" shows a technique where only the minimum or maximum, whichever varies most from the previously selected value, is saved in memory. However this scheme generally is not worth the inaccuracies introduced by saving only half the data. The scheme generally used today is described in U.S. Pat. No. 4,271,486 entitled "Waveform Storage System." The maximum and minimum digitized values over each period of time are found with digital logic and saved in memory. U.S. Pat. No. 4,755,960 entitled "Waveform Data Compressing Circuit" describes slight modifications to the basic peak detection scheme. In one modification each peak detect pair may be modified by a previous pair so that, when graphed, a vertical line is extended to touch the previous vertical line. Other modifications include keeping track of over-range and under-range codes, adding a constant to all values and allowing data to pass through without being peak detected.

U.S. Pat. No. 5,115,404 entitled "Digital Storage Oscilloscope with Indication of Aliased Display" describes another variation of peak detection. In addition to finding the maximum and minimum values over a period of time, the described circuit also finds the number of times that the slope of the signal changed and keeps track of which is found first, the maximum or the minimum. The maximum and minimum values are stored in memory in the order in which they occurred. Also included is an indicator that two or more changes of slope occurred. The data is then displayed as a bar between the maximum and minimum values. On the other hand when the slope does not change two or more times, the data is displayed as a line that goes through the two points, preserving the order.

U.S. Pat. No. 5,547,232 entitled "Method and Apparatus for Detecting/Storing Waveform Peak Value" appears to describe a scheme where the data is generated so rapidly that a single maximum and minimum circuit is expensive to build, so the data is divided into groups—perhaps parallel data streams—and the maximum and minimum in each group is found. U.S. Pat. No. 6,121,799 entitled "Interleaved Digital Peak Detector" describes a peak detection circuit where the data is divided into multiple pipes or paths and the peak values in each path are found.

U.S. Pat. No. 5,740,064 entitled "Sampling Technique for Waveform Measuring Instruments" describes how a mixture of peak detected data and decimated data may be acquired. The peak detected data is stored in memory when the peak amplitude is greater than a limit, otherwise the decimated data is stored. This allows low frequency signals with noise to appear less noisy. Although the displayed data may look better, this has the effect of making the peak detect mode "dishonest." U.S. Pat. No. 6,344,844 entitled "Digital Oscilloscope Having Improved Peak Detect Mode" indicates that both peak detected and decimated data may be saved in the acquisition memory. The decimated data is shown conventionally, but the peak detected data is displayed differently depending on any of a number of conditions. Most notably if the vertical height of the peak detect data is small, the peak detect data may be displayed with little intensity. This allows low frequency with little noise to be drawn primarily using the decimated data so that the peak noise is not emphasized. However the ability exists to draw with higher intensity peak detected data that is significantly different from previous or following data, such as narrow pulses.

In general filtering is viewed as a way to keep aliasing from occurring before decimation, as illustrated in U.S. Pat. No. 4,621,217 entitled "Anti-Aliasing Filter Circuit for Oscilloscopes." This scheme prevents aliasing by removing the high frequency signal components before performing the decimation. The filtering is done before the signal is digitized. U.S. Pat. No. 4,802,098 entitled "Digital Bandpass Oscilloscope" selectively removes frequency components so that only a given band of frequencies remain, allowing compression in the available memory over the desired period of time.

U.S. Pat. No. 5,233,546 entitled "Anti-Alias Filtering Apparatus for Frequency Domain Measurements" describes a technique for digitally filtering the data with a finite impulse response (FIR) lowpass filter. At high sample rates the data is first acquired in memory and then later filtered. However no compression is achieved. At sufficiently low sample rates the digitized data may be filtered and decimated before storing in memory. Many modern oscilloscopes, such as the TDS400, TDS500B and TDS700A digital oscilloscopes manufactured by Tektronix, Inc. of Beaverton, Oreg. have a mode called "HiRes." This acquisition mode uses a moving average filter, followed by decimation, to compress data. When used to observe low frequency signals, the HiRes filter significantly reduces high frequency noise. Unfortunately the HiRes moving average filter is not a good lowpass filter. It allows significant amounts of some high frequency signals to pass through, which are then aliased and appear as low frequency components.

What is desired is a fast and more intelligent way to compress sampled waveform data that preserves an "honest" display.

BRIEF SUMMARY OF THE INVENTION

Accordingly the present invention provides a waveform compression and display technique that saves both a peak detected version ("background" version) and a decimated and/or lowpass filtered version ("foreground" version) of a sampled electrical signal. The two versions are displayed simultaneously in such a contrasting manner so as not to obscure information contained in either of them. The foreground version may use just decimation or may use a series of simple lowpass filters with decimation to produce a single data stream from a plurality of data streams derived from the sampled electrical signal, the amount of lowpass filtering being adjustable from none to a maximum desired level. The single data stream may then be subjected to additional filtering to obtain a desired frequency bandwidth. When displayed simultaneously as overlaid waveforms, the background version pixels adjacent the foreground version pixels may be adjusted in intensity as one form of contrast so that the low frequency information of the decimated/lowpass filtered waveform is not lost, while the background version pixels further from the foreground version pixels may be intensified to highlight the high frequency information. By appropriately identifying the foreground and background version pixels, a single user control may be used to adjust the intensity of the background version pixels from zero to a maximum level of intensity over a first range, and to adjust the intensity of the foreground version pixels from a default value to a maximum, saturated value. The contrast also may be achieved by using different colors or levels of saturation between the foreground and background version pixels for display.

The objects, advantages and other novel features of the present invention are apparent from the following detailed description when read in conjunction with the appended claims and attached drawing.

DETAILED DESCRIPTION OF THE INVENTION

Figure 1:
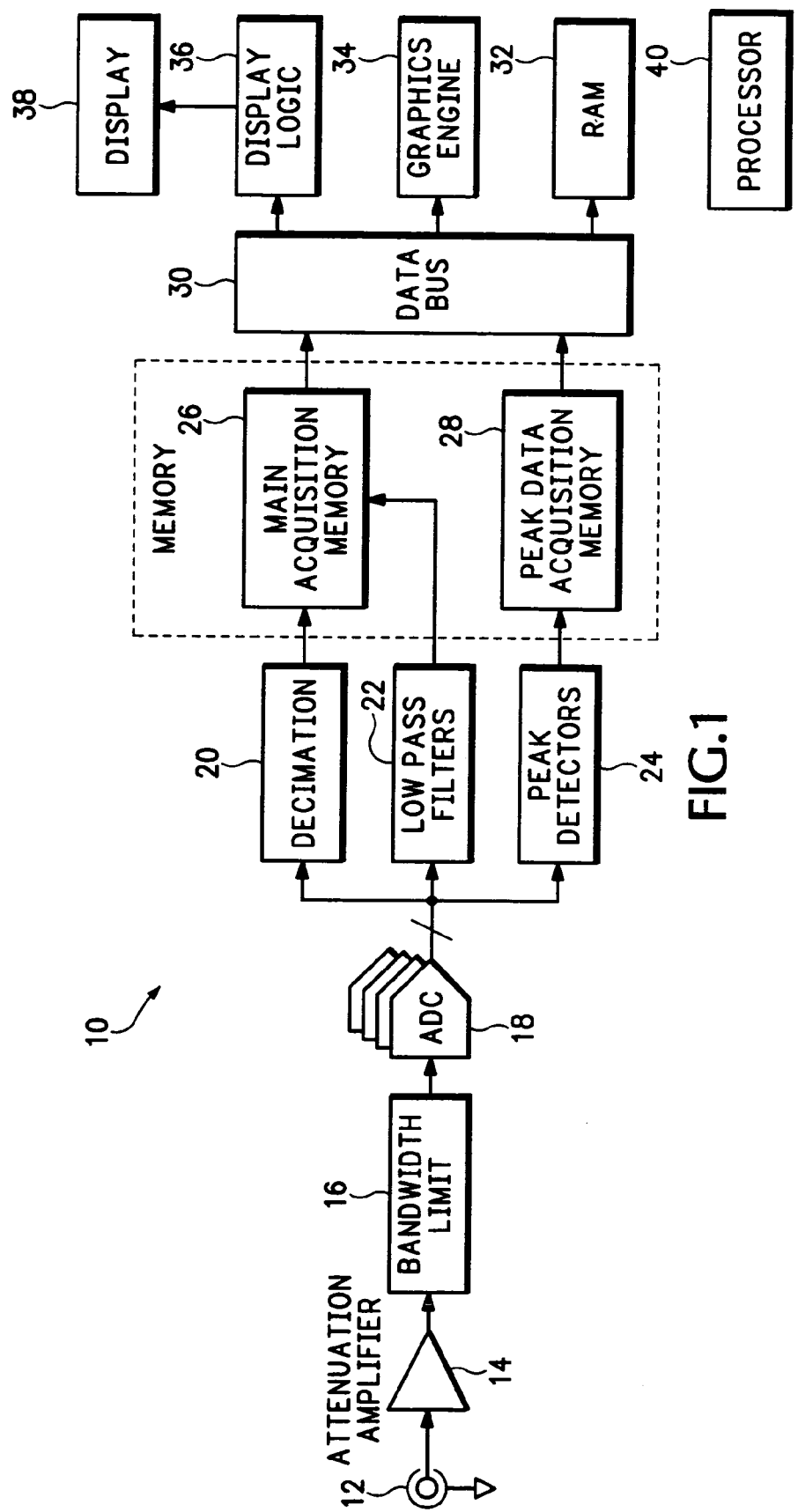
FIG. 1 is a block diagram view of a digital oscilloscope having waveform compression and display according to the present invention.

Referring now to FIG. 1 a digital oscilloscope 10 is shown having an input port 12 for receiving an electrical signal. The electrical signal from the input port 12 is input to an attenuator amplifier 14, a bandwidth limiter 16 and one or more analog-to-digital converters (ADCs) 18. The resulting digitized electrical signal in the form of data samples is input to three different compression modules in parallel—a conventional decimator 20, lowpass filters 22 and a peak detector 24. The decimated and lowpass filtered data samples from the decimator 20 and lowpass filters 22 are stored in a main acquisition memory 26, and the peak detect data samples from the peak detector 24 are stored in a peak data acquisition memory 28. The main acquisition memory 26 and the peak data acquisition memory 28 physically may be part of the same memory, as is well known in the art. Also the peak data acquisition memory 28 may be shorter in length than the main acquisition memory 26. The data samples from the acquisition memories 26, 28 are accessed for further processing via a digital data bus 30. Coupled to the digital data bus 30 are a random access memory (RAM) 32, a graphics engine 34 and a display logic 36. The output from the display logic 36 is presented for viewing on a display 38. All of the elements of the digital oscilloscope are under the control of a processor 40.

The following description is divided into sections on peak detection, lowpass filtering and display. For context each section is described for the digital oscilloscope 10 having an exemplary bandwidth of 200 MHz and sample rate of 2 GS/second. Although the circuitry for only one channel is described, the digital oscilloscope 10 may have up to four channels. Each channel has the attenuator amplifier 14 and the bandwidth limiter 16 that precede the ADCs 18. Collectively the ADCs 18 sample the conditioned analog signal from the bandwidth limiter 16 at a rate of 2 GS/second and produce 8-bit digitized data samples. The data samples are organized into eight data streams that are clocked every 4 ns. The data streams are delivered to the decimator 20, the lowpass filters 22 and the peak detector 24. The data bytes are referenced for the following discussion as $S(n)$, $S(n+1)$, ..., $S(n+7)$ where $S(n)$ is sampled last, $S(n+1)$ is sampled 0.5 ns previously, etc. In the previous 4 ns the data bytes are $S(n+8)$ through $S(n+15)$, etc.

The peak detector 24 finds the maximum and minimum values within successive periods of time in a conventional manner and stores these values in the peak data acquisition memory 28. The lowpass filters 22 remove high frequency components, decimate and store these values in the main acquisition memory 26. The decimator 20 may pass all the data samples or may decimate them, with the resulting values being stored also in the main acquisition memory 26. Although the decimator 20 and lowpass filters 22 are shown as individual circuits, they may be designed as a single unit and the amount of lowpass filtering applied may be adjustable from none to a maximum desired level. Also, as indicated above, the main and peak data acquisition memories 26, 28 may be combined. The contents of the acquisition memories 26, 28 are transferred via the digital data bus 30 to the RAM 32, and the peak detect data may be "tagged" as background data for display and the decimated/lowpass filtered data may be "tagged" as foreground data for display. The graphics engine 34, also referred to as a rasterizer, takes the acquired data samples from the RAM 32 and produces a picture of a waveform that also is stored in the RAM. The display logic 36 takes the waveform picture from the RAM 32, merges it with other graphics information and delivers the resulting image to the display 38. The processor 40, which may be one or more microprocessors, controls these operations. The other processes of the digital oscilloscope 10, such as triggering, performing measurements and transferring data through an interface to a printer or computer, are not shown for the purposes of this discussion, but are well known to those of ordinary skill in the art.

The peak detect data generally has a lower sample rate than the data from the decimator 20 and lowpass filters 22. The graphics engine 34, however, puts the peak detect data and the lowpass filtered/decimated data together despite the different sample rates. The information in the peak detect acquisition memory 28, in addition to providing information about the peak-to-peak signal amplitude, may be viewed as warning information. It provides the following warnings:

A narrow pulse occurred

A high frequency signal is present

The dynamic range of the ADCs 18 is being exceeded

The peak detect data comes in pairs. Each pair has a maximum value and a minimum value over a period of time. Of course when the period of time is two samples, no compression occurs. However to simplify circuit design the time interval for the time periods is preferably multiples of eight data samples.

Figure 2:
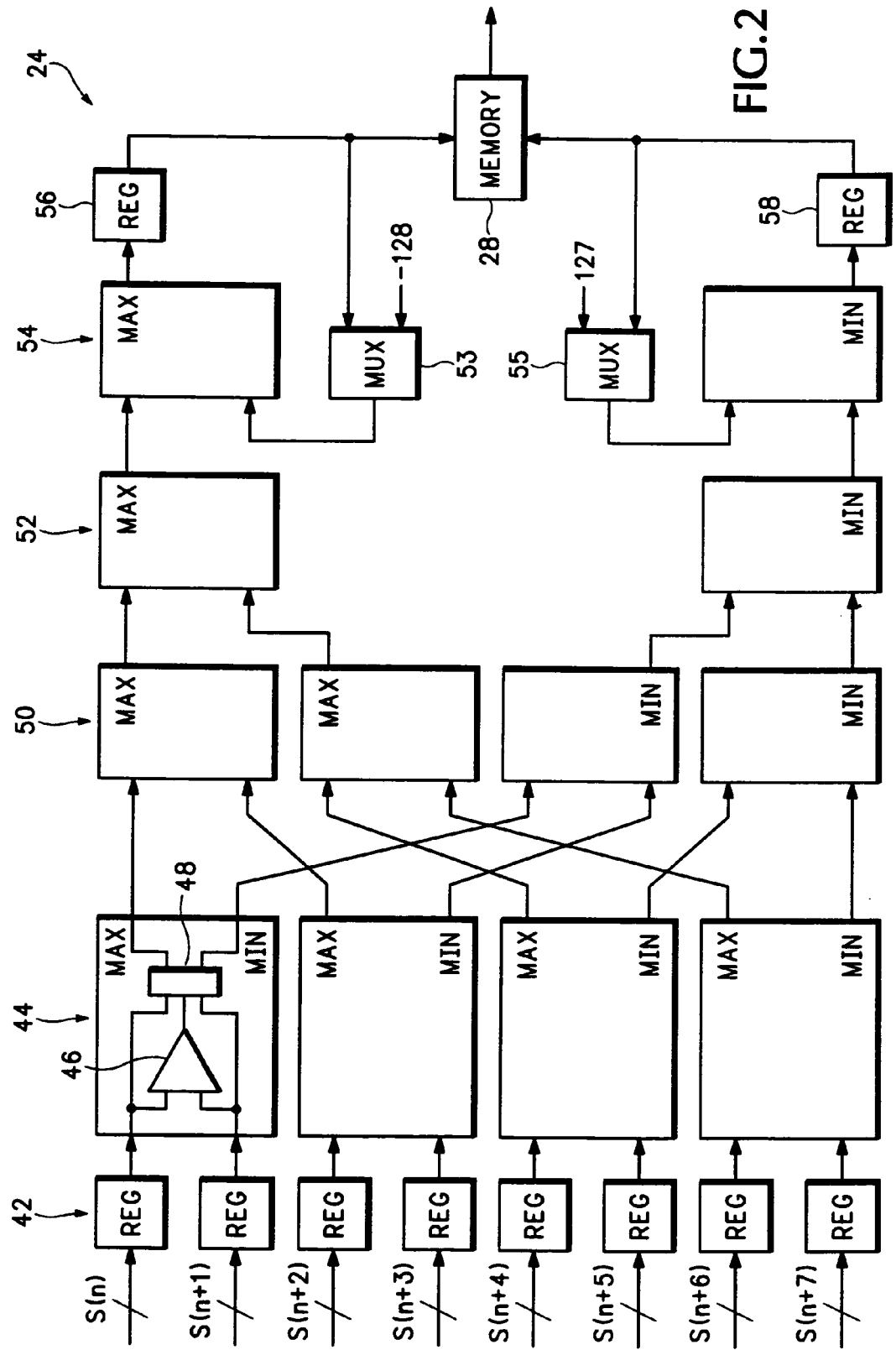
FIG. 2 is a block diagram view of a peak detection circuit for use in the waveform compression and display according to the present invention.

FIG. 2 shows the peak detector 24 in more detail. To aid in understanding, pipeline stages that allow the circuit to operate fast enough are not shown. Eight 8-bit values from the ADCs 18 arrive at the peak detector 24 each peak detection system clock (4 ns). These values $S(n)$ through $S(n+7)$ are clocked into respective input registers 42. The outputs of the input registers 42 go into max/min circuits 44. Each max/min circuit 44 has a digital comparator 46 that finds the larger of two inputs. The output of the comparator 46 controls a multiplexer 48 that routes the larger value to a "max" output and the smaller value to a "min" output. The first rank of four max/min circuits 44 finds the maximum and minimum values among pairs of the input registers 42. A second rank of four max/min circuits 50 is divided into two upper circuits that only find maximum values and two lower circuits that only find minimum values. A third rank of two max/min circuits 52 has an upper max/min circuit that finds the maximum value of all eight input registers 42 and a lower max/min circuit that finds the minimum value of all eight input registers.

A final rank of two max/min circuits 54 find maximum and minimum values over long periods of time. Referring to the upper of the final rank of max/min circuits 54, at the start of a period of time a multiplexer 53 selects −128 for input to one input of the max/min circuit so that it passes the other input from the third rank of max/min circuits 52 to a maximum register 56. This results in the maximum register 56 containing the largest of $S(n)$ through $S(n+7)$. On all following cycles of the peak detect system clock the last max/min circuit 54 compares the previous maximum value from the maximum register 56 with the new maximum value from the third rank of max/min circuits 52 and selects the larger to become the new content of the maximum register. In a similar fashion a minimum register 58 develops the minimum value over each period of time, with a lower multiplexer 55 initially selecting a value of 127 for input to the lower of the last max/min circuits 54. After the last peak detection system clock in the time interval, the maximum and minimum values from the maximum and minimum registers 56, 58 are written into the peak data acquisition memory 28.

The lowpass filters 22 perform lowpass filtering followed by decimation before writing data sample values into the main acquisition memory 26. The lowpass filters 22 are designed to filter out high frequency signal components before decimation to minimize aliasing which would otherwise make it impossible to reconstruct the low frequency signal. The lowpass filters 24 also reduce noise and other unwanted high frequency components of the signal. The lowpass filters 22 have to operate in real time with data samples that are arriving at a very fast rate. When the analog signal is sufficiently oversampled, decimation by a small amount may not cause aliasing of significant signal components. For example where the analog bandwidth is 200 MHz and the sample rate is 2 GS/second, decimation by two results in a sample rate of 1 GS/second. A digital lowpass filter is not required to prevent aliasing because the analog bandwidth of 200 MHz greatly reduces signal components above the Nyquist frequency of 500 MHz. Since a high speed, digital lowpass filter is not needed when decimating by two in this example, the lowpass filters 22 may be designed to only work at decimation rates of four or higher.

The lowpass filters 22 are designed by looking at the characteristics of the simplest kinds of lowpass filters. These simple filters fall into the class of moving average filters in which a few consecutive samples are summed. These filters may be described by a series of weights—the first weight is "multiplied" by the first sample, the second weight is multiplied by the second sample, etc. with all of the products being summed to get the filter output. For example the filter that adds two consecutive samples is (1 1). This filter has a gain of two at DC but a gain of zero at half the sample rate. It is more common to describe this filter as (0.5 0.5) so that the gain is one at DC, but to eliminate multipliers the filter coefficients are limited to "1." All of these simple filters have full gain at DC and have zero gain at certain frequencies, as listed in the following table.

| Filter Coefficients | Null Frequencies (relative to Nyquist) |
| --- | --- |
| 1 1 | 1 |
| 1 0 1 | ½ |
| 1 1 1 | ⅔ |
| 1 0 0 1 | ⅓, 1 |
| 1 1 1 1 | ½, 1 |
| 1 0 0 0 1 | ¼, ¾ |
| 1 0 1 0 1 | ⅓, ⅔ |
| 1 1 1 1 1 | ⅖, ⅘ |
| 1 0 0 0 0 1 | ⅕, ⅗, 1 |
| 1 1 1 1 1 1 | ⅓, ⅔, 1 |
| 1 0 0 0 0 0 1 | ⅙, ⅓, ⅚ |
| 1 0 0 1 0 0 1 | ⅔, 4/9, 8/9 |
| 1 0 1 0 1 0 1 | ¼, ½, ¾ |
| 1 1 1 1 1 1 1 | 2/7, 4/7, 6/7 |
| 1 0 0 0 0 0 0 1 | 1/7, 3/7, 5/7, 1 |
| 1 1 1 1 1 1 1 1 | ¼, ½, ¾, 1 |

When placing these filters in series, the nulls from each filter combine, i.e., the filter made by placing (1 1 1) in series with (1 0 0 1) has a null at ⅓, ⅔ and 1 time Nyquist. By placing many of these filters in series and selecting the filters so that there is a null near every unwanted frequency, the lowpass filters 22 have the desired characteristics. Also decimation is included to convert the data from eight parallel data streams to one data stream. Therefore the filtering and decimation are done such that frequencies that alias into a low frequency region are removed prior to decimation.

Figure 3:
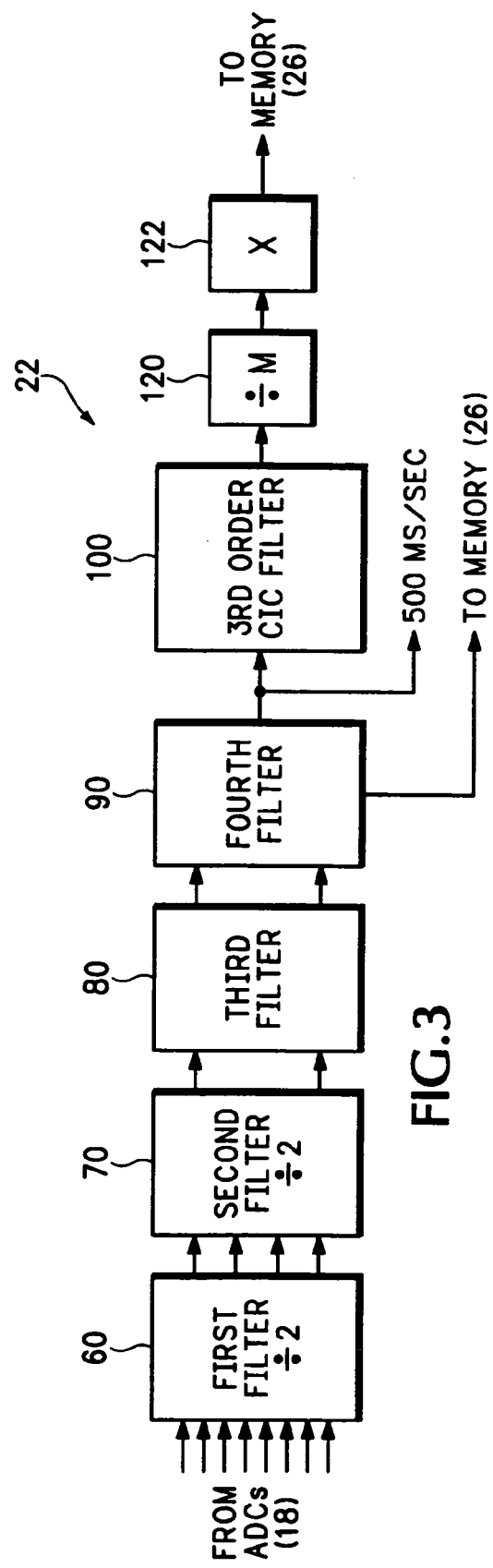
FIG. 3 is a block diagram view of a lowpass filter for use in the waveform compression and display according to the present invention.

A general outline of the lowpass filters 22 is shown in FIG. 3. (See generally E. B. Hogenauer "An Economical Class of Digital Filters for Decimation and Interpolation" IEEE Transactions on Acoutics, Speech and Signal Processing, ASSP-29 (2):155-162, 1981) The eight data streams, or pipes, from the ADCs 18 pass into a first filter stage 60. The output of the first filter stage is decimated by two and passes to a second filter stage 70. Again the signal is decimated by two so that there are only two data streams leaving the second filter stage 70. The signal is then passed through third and fourth filter stages 80, 90. At the output of the fourth filter stage 90 the signal may either be stored in the main acquisition memory 26 or be decimated by two and passed into an additional filter stage 100, such as a cascaded integrator-comb (CIC) filter described by Matthew P. Donadio in the article "CIC Filter Introduction" (http://users.snip.net/~donadio/cic.pdf). The additional filter stage 100 allows filtering over a wide range of frequencies. The output of the additional filter stage 100 may be further decimated by M (120). Finally a multiplier 122 adjusts the gain at DC to one before writing the data into the main acquisition memory 26.

Figure 4:
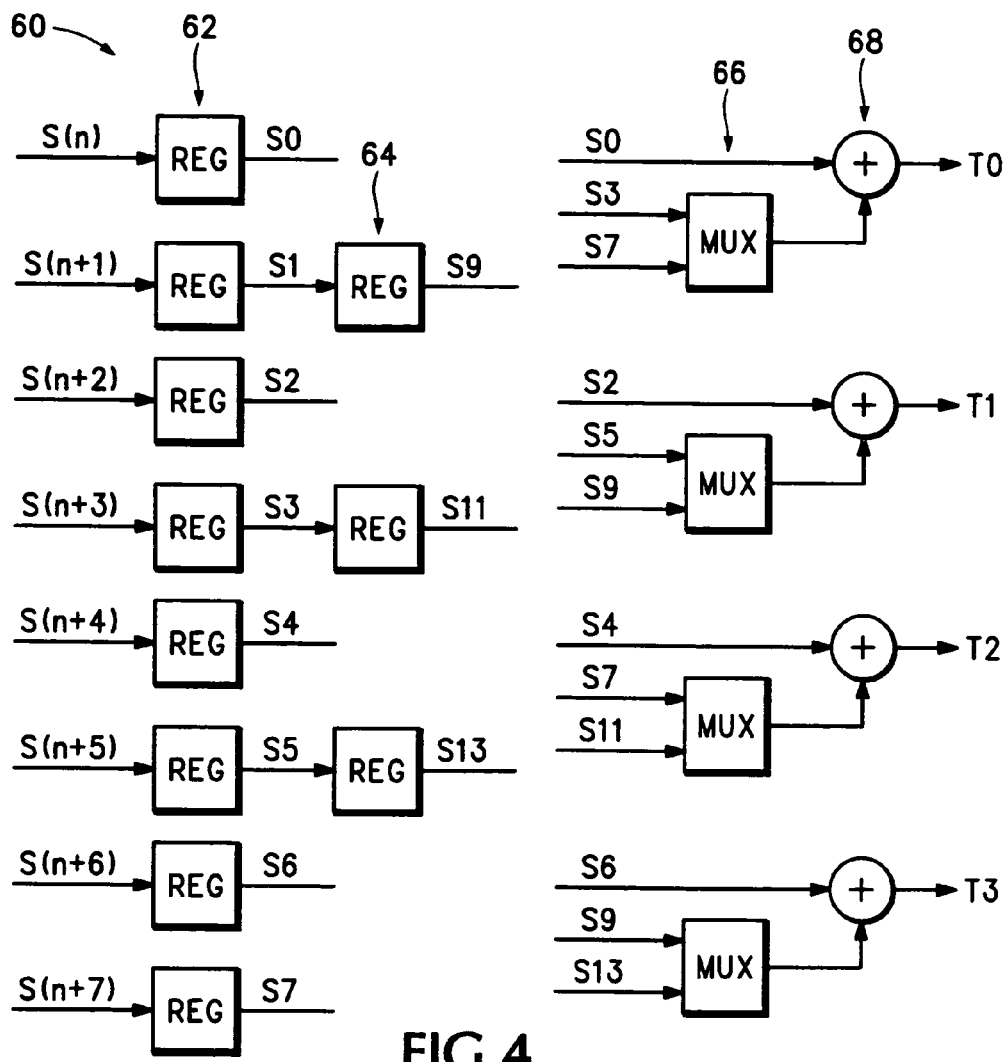
FIG. 4 is a block diagram view of a first filter stage for the lowpass filter of FIG. 3 according to the present invention.

The first filter stage 60 is programmable and may be either (1 0 0 0 0 0 0 1) or (1 0 0 1). As shown in FIG. 4 eight pipes from the ADCs 18 are clocked every 4 ns into respective input pipeline registers 62, and are labeled S0 through S7. The former S1, S3 and S5 data are clocked into additional pipeline registers 64 and become S9, S11 and S13. Data S0 is the oldest, data S1 is sampled 500 ps earlier, data S9 is sampled 4.5 ns before S0, etc. In a high frequency sampling mode multiplexers 66 select the upper input, causing T0 to be the sum (68) of S0 and S3 which is (1 0 0 1) times (S0 S1 S2 S3). This filter has a gain of zero at ⅓ of Nyquist or 333 MHz and at 1 GHz. In a low frequency mode the multiplexers 66 select the lower input, causing T0 to be the sum (68) of S0 and S7 which is (1 0 0 0 0 0 0 1) times (S0 S1 S2 S3 S4 S5 S6 S7). This filter has a gain of zero at 1/7, 3/7, 5/7 and 1 of Nyquist or 143 MHz, 429 MHz, 714 MHz and 1 GHz. The first filter stage 60 performs decimation by two and uses all eight inputs.

Figure 5:
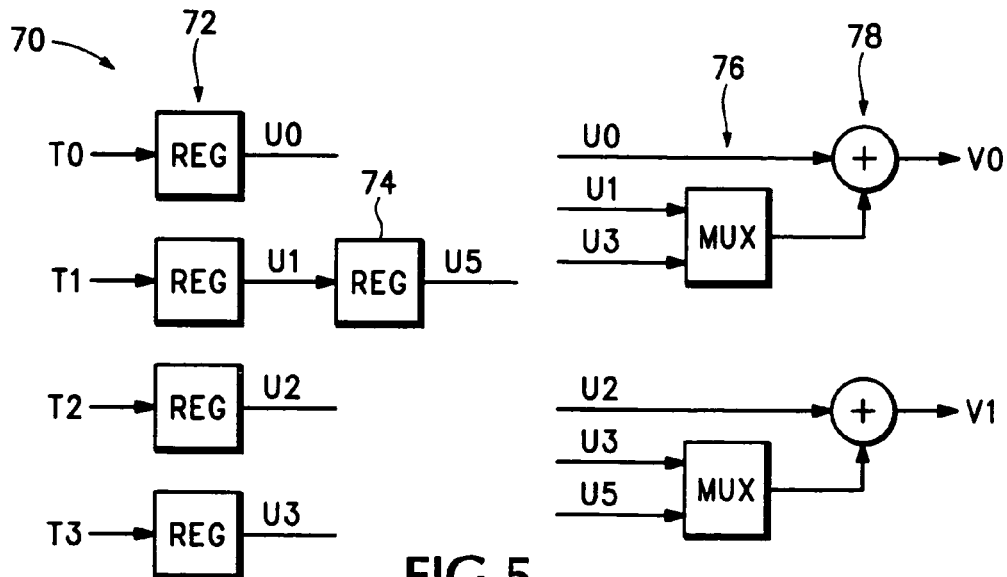
FIG. 5 is a block diagram view of a second filter stage for the lowpass filter of FIG. 3 according to the present invention.

As shown in FIG. 5 the data T0 through T3 in each stream are now 1 ns apart and the Nyquist frequency is 500 MHz. In the high frequency mode the second filter stage 70 is (1 1) with a gain of zero at 500 MHz. In the low frequency mode the second filter stage 70 is (1 0 0 1) with a gain of zero at 167 MHz and 500 MHz. Input registers 72 receive the outputs T0 through T3 from the first filter stage 60, and are labeled U0 through U3. The signal U1 is input to another register 74 to produce an output U5. U0 is summed (78) via a multiplexer 76 with U1 in the high frequency mode or with U3 in the low frequency mode, while U2 is summed (78) via a multiplexer 76 with U3 in the high frequency mode or with U5 in the low frequency mode. The second filter stage 70 performs decimation by two to produce data streams V0 and V1, using all four inputs T0 through T3.

Figure 6:
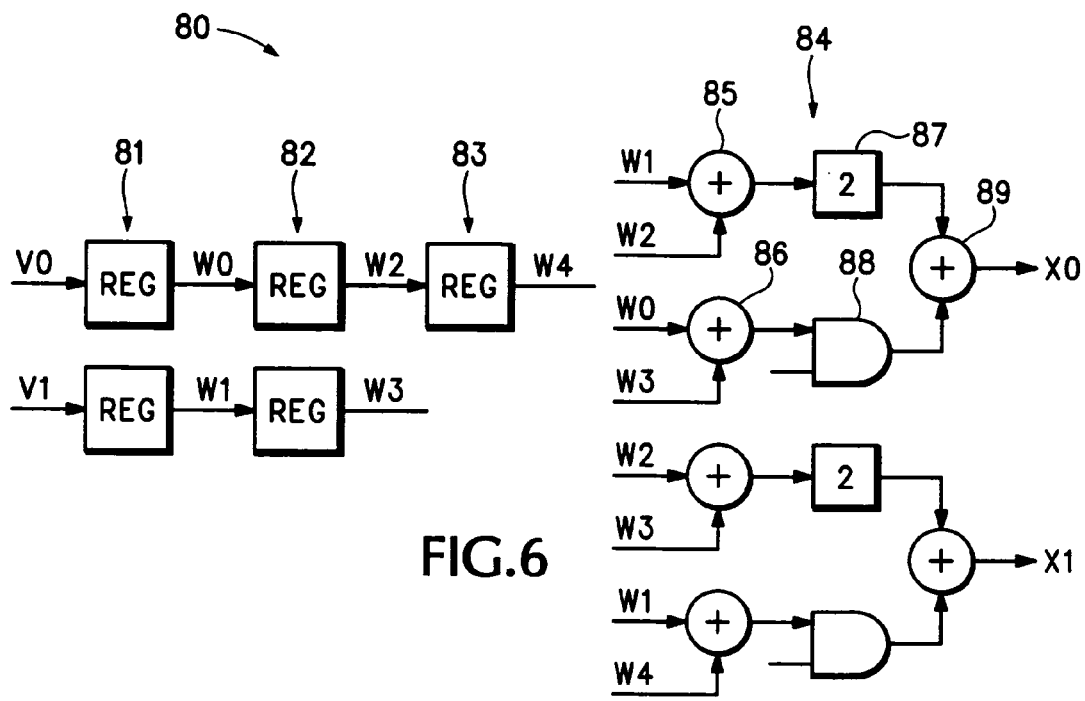
FIG. 6 is a block diagram view of a third filter stage for the lowpass filter of FIG. 3 according to the present invention.

At the third filter stage 80, shown in more detail in FIG. 6, the data V0 and V1 is now 2 ns apart and the Nyquist frequency is 250 MHz. The data is input to input registers 81 and labeled W0 and W1, which in turn are input to intermediate registers 82 and labeled W2 and W3. W2 is input to a third register 83 to produce W4. In the high frequency mode AND gates 88 block the sums (86) W0+W3 and W1+W4 while the outputs X0 and X1 from output summers 89 reflect twice (87) the sums (85) of W1+W2 and W2+W3 so that the third filter stage 80 is (2 2) with a gain of zero at 250 MHz. In the low frequency mode the sums (86) W0+W3 and W1+W4 pass through the AND gates 89 resulting in a filter of (1 2 2 1), which is the combination of filters (1 1) and (1 1 1). The third filter stage 80 now has a gain of zero at 167 MHz and 250 MHz. Because of decimation 333 MHz is aliased to 167 MHz, and is removed.

Figure 7:
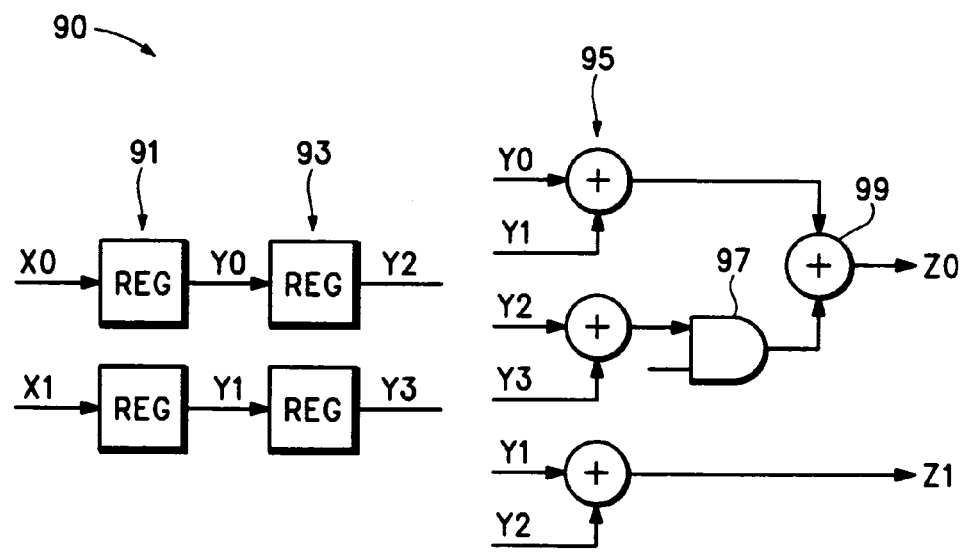
FIG. 7 is a block diagram view of a fourth filter stage for the lowpass filter of FIG. 3 according to the present invention.

The fourth filter stage 90 is shown in FIG. 7 where the inputs X0 and X1 are received by input registers 91 and labeled Y0 and Y1 which in turn are received by subsequent registers 93 and labeled Y2 and Y3. The combinations Y0+Y1, Y1+Y2 and Y2+Y3 are summed 95. The Y1+Y2 sum becomes one output Z1, while in the high frequency mode AND gate 97 blocks Y2+Y3 so the Z0 output is the sum Y0+Y1. The data from Z0 and Z1 is sent to the main acquisition memory 26 every 4 ns, allowing data to be stored at a rate of 500 MS/second. The bandwidth with all the filter stages 60, 70, 80, 90 in the high frequency mode and with a 200 MHz front end is about 80 MHz. The DC gain of each filter in the high frequency mode is thirty-two. This is converted to a gain of one by shifting the Z0 and Z1 outputs when writing them into the main acquisition memory 26. The largest gain above Nyquist is about 0.01, so very little signal is aliased. In the low frequency mode the signal Y2+Y3 passes through the AND gate 97 and is summed (99) with Y0+Y1 to produce the Z0 output, i.e., Z0 is the sum of Y0, Y1, Y2 and Y3. The gain of the third filter stage 80 in this mode is zero at 250 MHz and 500 MHz and only the Z0 output is used for a decimation by two. The Nyquist frequency becomes 125 MHz. With all filter stages 60, 70, 80, 90 in the low frequency mode the gain is zero at 125 MHz, 143 MHz, 167 MHz, 250 MHz, 333 MHz 375 MHz, 429 MHz and 500 MHz. The bandwidth of these filters with a 200 MHz front end is about 36 MHz. The DC gain of the filters is 2*2*6*4 or 96, which gain is corrected later. The largest gain above Nyquist is about 0.0008 times the DC gain so, again, very little signal is aliased.

Figure 8:
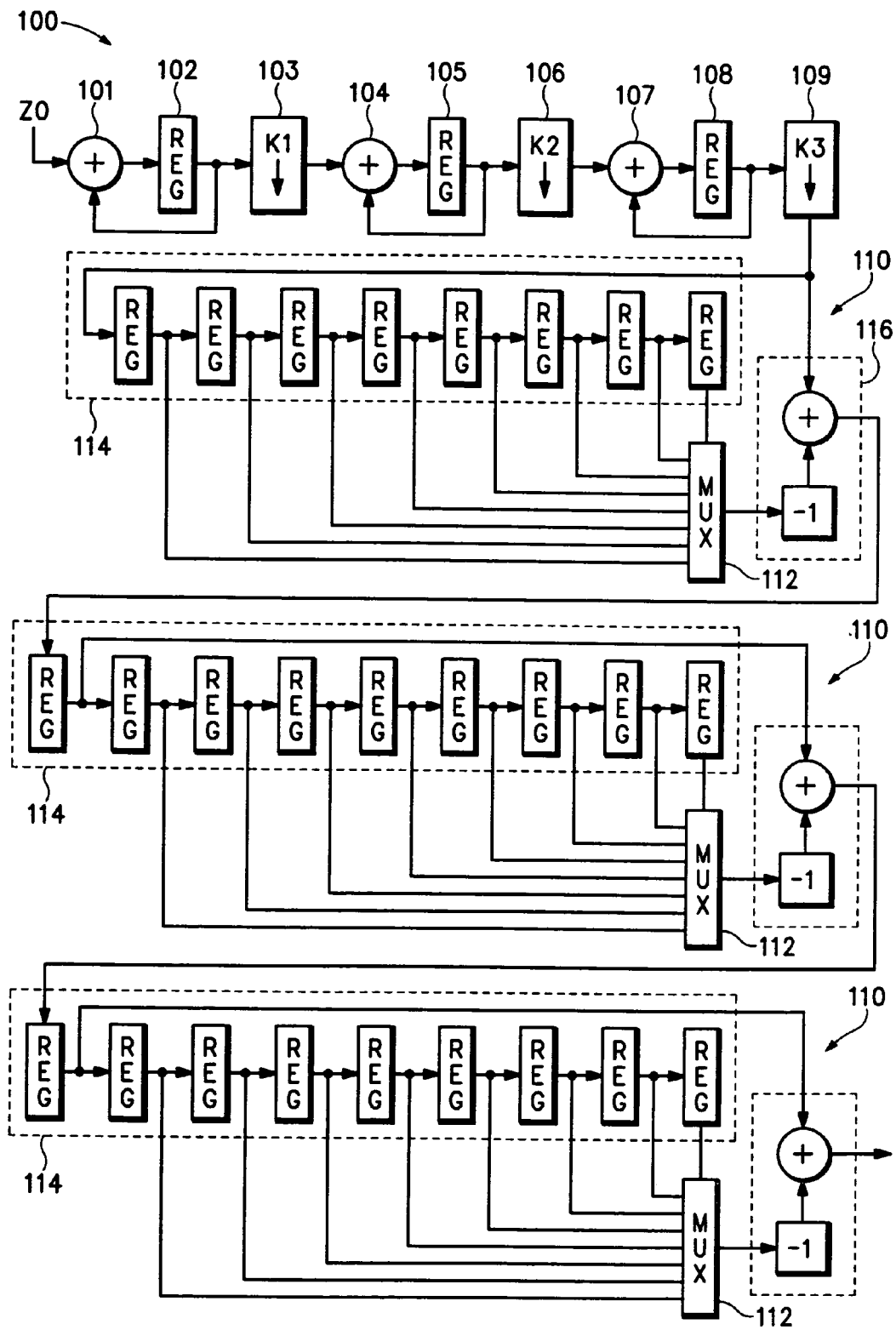
FIG. 8 is a block diagram view of an additional filter stage for the lowpass filter of FIG. 3 according to the present invention.

As shown in FIG. 8 the additional CIC filter stage 100 has three programmable moving average filters with Z0 as an input. These moving filters may pass the signal without filtering, or may filter to a very low frequency. New data arrives at the input every 4 ns and is accumulated (101) in a first register 102. Although the first register 102 may have twenty extra most significant bits, it still eventually overflows. The output from the first register 102 goes to a first shifter circuit 103 that shifts the data K1 places to the right—K1 may be in the range from 0-20, i.e., when K1 is zero no shifting occurs. The output of the first shifter 103 is rounded by making use of the carry input in a following adder 104 which is part of a second accumulator including second register 105. The output of the second accumulator 105 goes into a second shifter 106 having a second shift factor K2. The output of the second shifter 106 goes into a third accumulator 107, 108 and shifter 109 with shift factor K3. Following the three accumulators there are three difference circuits 110. While the accumulators are clocked every 4 ns, the difference circuits 110 operate on a decimated clock, i.e., they may clock every 8 ns, 12 ns, etc., or every 4 ns but take on new values every 4 ns, 8 ns, 12 ns, etc. A multiplexer 112 in each difference circuit 110 selects a tap along a shift register 114. If the first tap is selected and if the circuit is clocked every 4 ns, each difference circuit 110 reverses the accumulating done in one of the previous accumulators and data passes through the additional CIC filter stage 100 unchanged.

Operation of the accumulators and difference circuits is best illustrated by starting with a single accumulator followed by a single difference circuit. When both circuits are clocked together, the pair operate as a simple moving average filter. The multiplexer 112 in the difference circuit 110 selects the number of terms in the moving average. When the first tap is selected a moving average of one term is selected and the filter passess the input without modification. Both the accumulator and difference circuits may be considered to use modulo arithmetic so that an overflow in an output adder 116 does not cause an error in the output. When the second tap is selected, the difference circuit now produces output that is the sum of two consecutive values accumulated by the accumulator 101-109. When the last of the eight taps is selected, a moving average of eight terms is produced. However the output has not been decimated. The additional CIC filter stage 100 produces a correct output on every clock.

When difference clock rate is one-half that of the accumulator clock, the input seen by the difference circuit 110 always reflects two accumulated values, causing the length of the moving average sequences to double. Also the output is decimated by two. When the ratio of clocks is N, the length of the moving average sequence is multiplied by N and the output is decimated by N. By placing three accumulators 101-109 in series followed by three difference circuits 110 the output is filtered by the three moving average sequences specified by the three difference circuits.

As the clock ratio, N, becomes larger, the output becomes larger at a rate of N to the third power. The gain of each filter is N times the number of registers in the negative path. Since three filters are in series, the gain of the three filters of the additional CIC filter stage 100 is A*B*C*N*N*N where A, B and C are the number of registers in the negative path of the first, second and third difference circuits 110. In order to take the filter frequency down to around 1 kHz, the value of N is around one million so the total gain is around 1 E20, requiring the last difference circuit 110 to have registers containing about 75 bits. However this is avoided by the three shifter circuits 103, 106, 109. As N becomes large, these shifter circuits throw away the least significant bits, allowing the last difference circuit 110 to use 16-bit registers. The multiplexers 112 in the three difference circuits allow a wide range of filters to be programmed. A few combinations are worth noting. A moving average of 5, 6 and 8 terms produces a filter that may be followed by a decimation of four with less than one percent of any high frequency signal component being aliased. A moving average of 3, 4 and 5 terms, 4, 5 and 6 terms or 5, 6 and 7 terms also produce a good lowpass filter.

Following the additional CIC filter stage 100 is the programmable decimator by M 120. The values of M may range from 1 for no decimation to four to select one item in each four. A multiplier circuit 122 follows the last decimation and corrects the gain error that accumulated through all of the filter stages 60-100. Alternatively the raw data may be written into the main acquisition memory 26 and the gain corrected in the graphics engine 34 and when data is presented to the user on the display 38.

Figure 9:
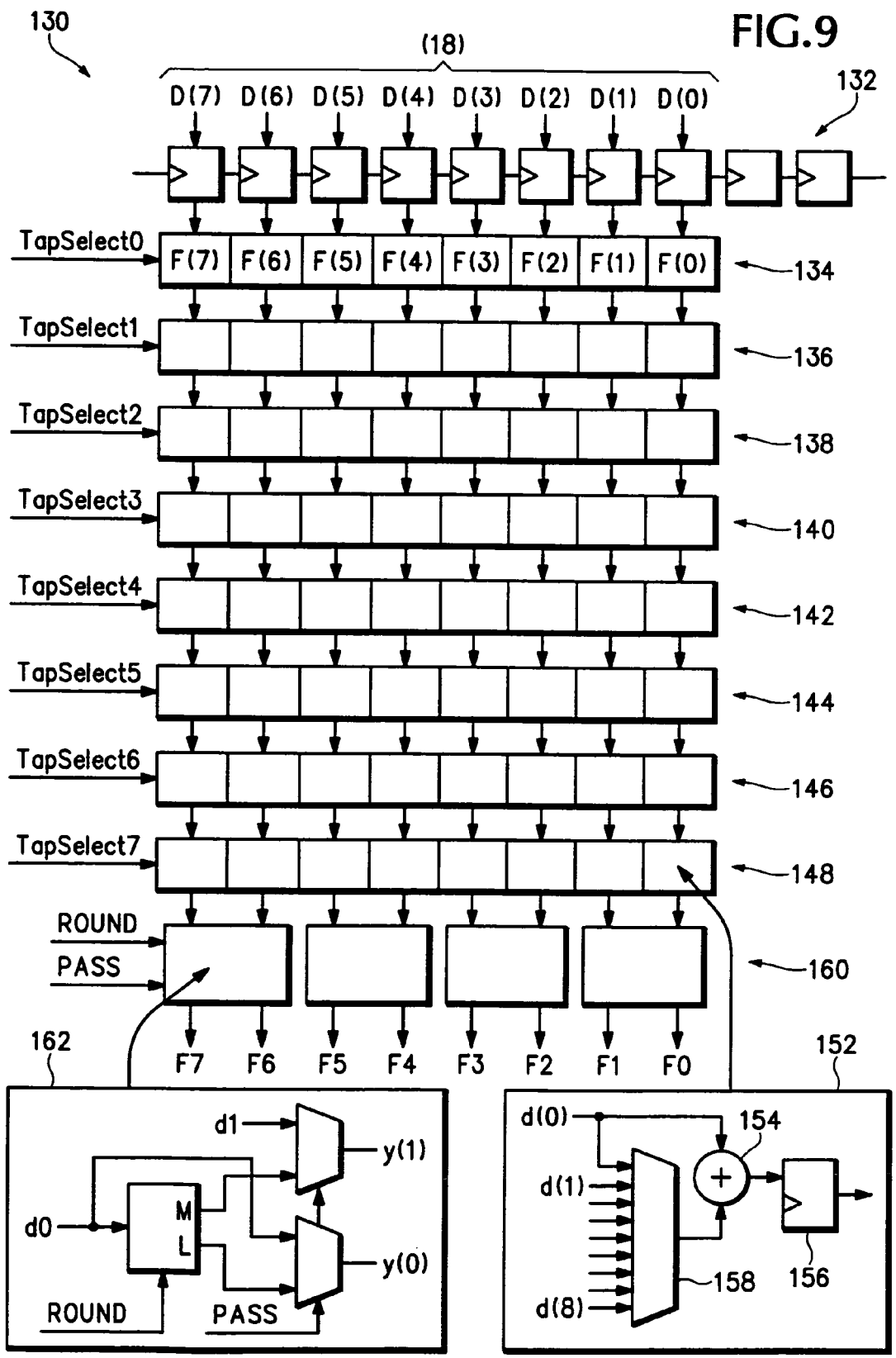
FIG. 9 is a block diagram view an alternative lowpass filter stage to replace the filter stages of FIGS. 4-7 according to the present invention.

Although the lowpass filtering described in FIGS. 3-7 uses four lowpass filter stages 60-90 prior to the CIC filter stage 100, an alternative lowpass filter 130 is shown in FIG. 9 which may replace the first four lowpass filter stages. The alternative lowpass filter 130 filters data for decimation rates less than or equal to eight, but for decimation rates greater than eight the CIC filter stage 100 is used. As before at all decimation rates all frequencies above Nyquist are rejected to below one percent. Eight 8-bit samples are loaded on each system clock into an upper register 132. The sample data order is: D0 is the earliest sample and D7 is the last acquired sample. The data then passes down into eight layers of filter elements 134-148. At each layer another bit of precision is maintained. By the time the data reaches the bottom of the layers 134-148 the data has been filtered. As shown there are 64 filter elements, with each filter element F(n) being associated to the original D(n) input sample. Each filter element 152 adds (154) two values and places the result in a register 156. One value comes from the element in the layer directly above, and the other value is selected by a multiplexer 158 with one of the values being the value being passed down. When the passed down value is selected, data is passed through the filter element after being doubled. The remaining multiplexer inputs come from inputs to the filter elements that are in the same layer, but further to the right. Each layer in the filter block is capable of applying a simple filter made from two terms. A multiplexer selection of D(0) indicates the same term is added to itself. A multiplexer selection of D(1) indicates that the value of the adjacent filter element is added; a multiplexer selection of D(2) indicates that the value of the filter element two samples to the right is added, etc. This type of filter element produces many different filters.

The multiplexers 158 in any layer are all the same—a TapSelect0 control may be set to control all the filter elements 152 of the first layer (layer 0) to select the adjacent sample value; a TapSelect1 control may be set to control all of the filter elements of the next layer down (layer 1) to select the data value five to the right; etc. Since some of the multiplexer taps may extend past the edge of the filter layer, there actually is additional circuitry (not shown) to the right of the filter layer. Every system clock new data is shifted eight places to the right and the contents of the registers 156 in the filter elements 152 are also shifted eight places to the right. These additional registers, which are logically located to the right of the filter block 130 are not shown. The top register 132 also extends to the right.

In all cases the output of the lowpass filter 130 is the result of eight additions, so that when 8-bit data is inserted at the top, the data at the bottom is 16-bit data. The order in which the filter operations are applied does not matter as long as the filter implementation option is supported for the layer. On set of lowpass filters that may be used to prevent aliasing before decimation is shown in the following table:

|  | Decimation | | | |
| --- | --- | --- | --- | --- |
| TapSelectx | 1 | 2 | 4 | 8 |
| TapSelect0 | 0 | 2 | 4 | 8 |
| TapSelect1 | 0 | 2 | 3 | 6 |
| TapSelect2 | 0 | 2 | 2 | 5 |
| TapSelect3 | 0 | 1 | 2 | 4 |
| TapSelect4 | 0 | 1 | 2 | 3 |
| TapSelect5 | 0 | 1 | 1 | 2 |
| TapSelect6 | 0 | 1 | 1 | 2 |
| TapSelect7 | 0 | 0 | 1 | 1 |
| Bandwidth (MHz) | 200 | 160 | 80 | 40 |

For example the decimation by four column of the table shows filters that may be used to make a lowpass filter with a bandwidth of 80 MHz. This filter is used before decimation by four to prevent aliasing. The multiplexer 158 may be modified into two separate multiplexers with the top multiplexer selecting D(0), D(1) and D(2) and the bottom multiplexer selecting D(0), D(5) and D(8), with the outputs of the multiplexers going to the adder 154. This reduced filter element has additional implementation delay in addition to the typical filter group delay.

The final stage of the lowpass filter 130 is a pass/round layer 160 of four pass/round blocks 162. For low resolution the 16-bit lowpass filtered data may be rounded to 8-bit precision, decimated and stored in the memory 12; and for high resolution the 16-bit data may be decimated and stored in the memory. When data is not being filtered, the pass/round block 162 allows the sample data to pass without change. When data is being filtered but not rounded, the 16-bit input is routed to two 8-bit outputs. When data is being filtered and rounded, the round input controls an add of 0x0080 to d0 and outputs the result on y0. By having 8-bit outputs the pass/round block 162 cuts in half the number of routing channels used in following blocks. During decimation only some of the outputs of the filter block 130 are used, depending upon the decimation mode and rate.

Having both decimated/lowpass filtered samples in the main acquisition memory 26 and peak detected samples in the peak data acquisition memory 28, the display logic 36 now has to present an intuitive and beautiful image for the user on the display 38. The displayed waveform should neither mislead the user by showing signals that are not in the original signal nor hide important signal components that are present in the original signal. The peak detected version of the waveform signal tends to obscure the decimated/lowpass filtered version if both versions are displayed at full intensity. Therefore some way to contrast the two versions is desired.

Figure 10:
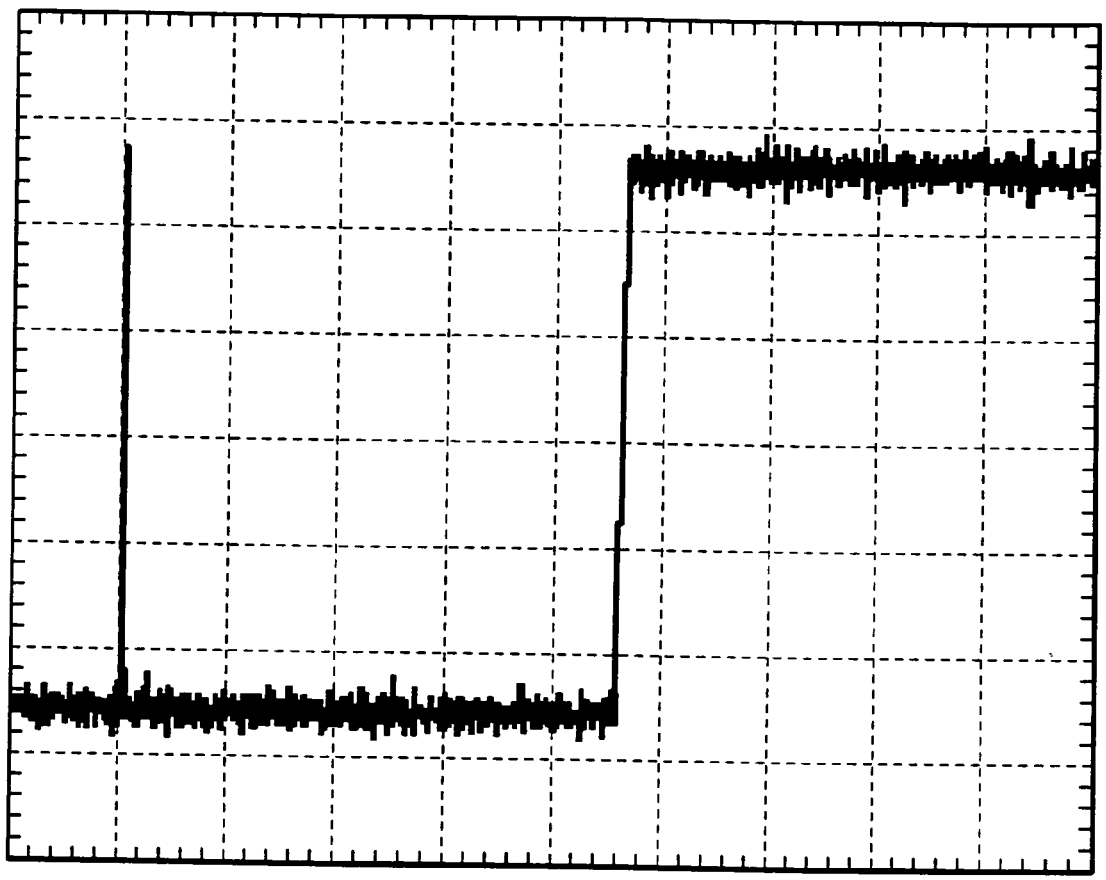
FIG. 10 is a plan view of a graphic display of waveform data according to the prior art.
Figure 11:
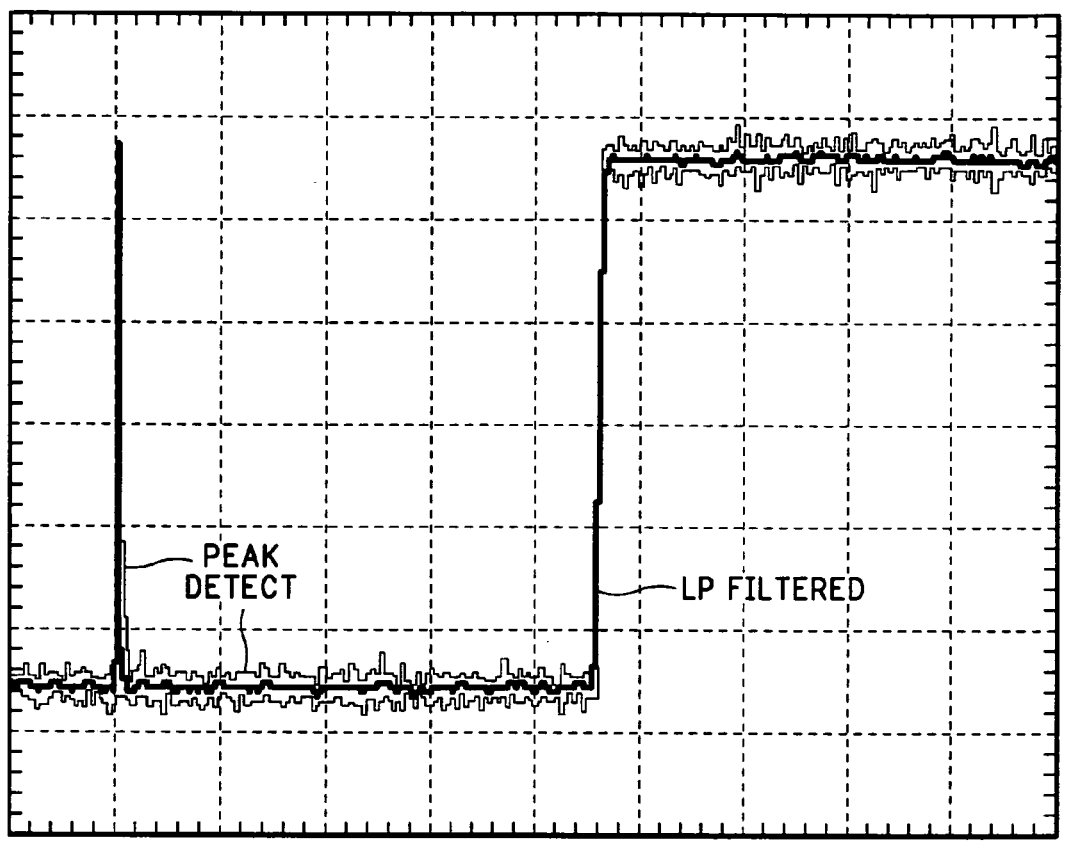
FIG. 11 is a plan view of a graphic display of waveform data processed by the compression and display scheme of the present invention.

One way to display both versions without obscuring either one is to draw the peak detected version (background version) of the waveform in the normal way and then, while drawing the decimated/lowpass filtered version, reducing the brightness of the previously drawn peak detected signal in the vicinity of the lowpass filtered version (foreground version) of the signal. FIG. 10 shows a peak detected signal in the normal way, while FIG. 11 shows the same signal with both peak detected and lowpass versions. The brightness of the peak detected version is reduced when near the lowpass filtered version allowing the lowpass filtered version of the signal to be observed. The brightness of the peak detected version increases with the distance from the lowpass filtered version. The number of pixels between the background and foreground versions over which the brightness is varied may be adjusted from one or two pixels to a specified maximum number.

It is not necessary to draw the peak detected version at full brightness and later reduce the brightness. The display logic 36 may produce both versions of the waveform at the same time. The display logic 36 determines the distance of each peak data pixel from the lowpass filtered signal and draws the peak data pixels with the proper intensity. The display 38 looks better when considering the last, the current and the next lowpass filtered signal points when reducing the brightness of the peak detected version. Brightness refers to different shades of gray where the brighter shade is the one that stands out from the background. Different colors may be used instead of shades of gray, and different saturation levels of colors may be used.

Another way of contrasting the two versions for display is to provide a user "intensity" control that treats the two versions differently. For example the user control may adjust the intensity of the background version pixels from zero to a specified maximum value over a first range, and then adjust the intensity of the foreground version pixels from a default level to a maximum, saturated value over a second range. In this way only the foreground version pixels may be seen, or the background version pixels may be adjusted in intensity as against the foreground version pixels, or finally the foreground version pixels may be intensified against the background version pixels to provide a user with maximum flexibility in providing a true view of the sampled signal waveforms.

Of course the contrast may be achieved also by just using different colors or saturation levels for the two versions as well. The user has the choice of which technique to use to provide the display of the sampled signal waveforms.

When the ADCs 18 reach the end of their ranges, these codes are put into the peak detected version of the signal. When limit codes are found, the lowpass filtered version of the signal may not be accurate. This information is displayed so the user knows not to trust the lowpass filtered version of the signal. The intensity or color of the lowpass filtered version may be changed to indicate that it may not be accurate. The intensity may be such that the signal is not seen. Also the color or intensity of the peak detected version may be changed. Warning messages or icons also may be placed on the screen.

Waveform data is sometimes displayed as a spectrum, especially through the use of a Fast Fourier Transform (FFT) algorithm. When showing frequency domain information, only the lowpass filtered version of the signal is used. A couple of strategies may be used to make sure that the information being displayed is accurate. First, portions of the spectrum that may not be reliably displayed are not shown, i.e., there is no reason to show the spectrum up to the Nyquist frequency—either there is no signal near the Nyquist frequency because it has been removed by filtering or there may be aliased components near the Nyquist frequency because of not enough filtering. There is always the possibility of a small amount of an aliased signal because the filters are not perfect. By limiting the FFT display to only the stronger signals, the very weak aliased signals are hidden. Alternatively portions of the FFT display that may contain aliased signals may be indicated so the user is cautious of a signal within such a region. These regions may be indicated by shading the display or by using a different background color.

The lowpass filtered version of the signal may be further filtered after being stored in the main acquisition memory 26. The additional filtering may be done by a microprocessor or by the graphics engine 34. This filtering further reduces the bandwidth. In the process of reducing the bandwidth, the degree of alias reduction is improved. The bandwidth may also be increased to a small degree by boosting the gain at some frequencies that have been attenuated by prior filtering. Interpolation may be used to increase the sample rate. The horizontal resolution of the display 38 sets a limit to displaying high frequency information. The lowpass filtered data is re-filtered before making the waveform image to remove high frequency information above the Nyquist frequency set by the horizontal resolution of the display. This makes the waveform image independent of the record length, since record length is a function of the lowpass filter cutoff frequency which in turn is a function of the sample rate after decimation, i.e., the amount of noise seen in the waveform image otherwise is a function of the record length. Also the high frequency noise is eliminated from the lowpass filtered waveform, causing the trace to be sharp.

An alternative to lowpass filtering is to use a waveform produced through waveform averaging. When performing waveform averaging the oscilloscope 10 acquires many waveforms and then displays an averaged waveform image. The averaged waveform image is found by averaging the first point in each waveform to make the first point in the averaged waveform image, then averaging the second point in each waveform to make the second point in the averaged waveform image, etc. In practice waveform averaging is often performed in a continuous fashion, not requiring many waveforms to be held in memory at one time. A particular advantage of waveform averaging is that it tends to remove all signals, such as noise, that are not synchronous to the trigger. Because of this noise reduction, an averaged waveform often looks very similar to a lowpass filter waveform.

Also an envelope waveform may be used instead of a peak detected waveform. An envelope waveform is formed by acquiring many waveforms, as is done when performing waveform averaging. The first pair of points in the envelope waveform is found by finding the maximum and minimum of the first point in all of the acquired waveforms, the second pair of points in the envelope waveform is found by finding the maximum and minimum of the second point in all of the waveforms, etc. The averaged or envelope waveforms represent another form of compression by acquiring many waveforms without decimation and producing a single waveform to represent the data from all the waveforms. The primary advantage of waveform averaging is that it reduces noise and other signals that are not correlated to the trigger while not reducing bandwidth of signals that are synchronous with the trigger.

Waveform averaging may be performed on a number of lowpass filtered waveforms, and waveform enveloping may be performed on peak detect waveforms. The resulting waveform display may be obtained from any of the following:
- a lowpass filtered waveform with a peak detect waveform
- an averaged waveform with an envelope waveform
- an averaged waveform from a number of lowpass filtered waveforms and an envelope waveform from a number of peak detect waveforms.

Not every kind of signal benefits from the above described compression and displaying scheme. For instance video waveforms are typically displayed in a way that mimics the display seen on an analog oscilloscope. This is best done by using decimation without lowpass filtering. The decimated data is then displayed using a scheme that shows brightness as a function of the time the signal is at a particular voltage.

Although not as desirable, a lower quality filter, such as the HiRes filter described in the Background above, may be used in lieu of a good lowpass filter to produce the displays described above. Such a lower quality filter is easier to implement and still significantly reduces noise and reduces some aliasing.

Thus the present invention provides a compression and display technique that provides a lowpass filtered waveform and a peak detected waveform from an input signal that reduces noise and eliminates most frequency aliasing, the two waveforms being displayed simultaneously in a manner so as not to obscure the information contained in each of them.

What is claimed is:

1. A digital acquisition system that compresses sampled data prior to storage comprising:
   - means for digitizing an electrical signal at a high sample rate to produce a sampled data stream;
   - means for compressing the sampled data stream in parallel simultaneously with a plurality of compression schemes, at least one of the compression schemes being a lowpass filtering scheme, to produce a compressed sampled data stream for each compression scheme; and
   - means for storing the compressed sampled data streams as acquired sample data for each compression scheme.

2. The digital acquisition system as recited in claim 1 further comprising:
   - means for generating a graphic waveform image from the acquired sample data for each compression scheme to produce respective waveform images; and
   - means for displaying the respective waveform images overlaid with each other so as not to obscure information contained in any of the waveform images.

3. The digital acquisition system as recited in claim 1 wherein the compressing means comprises:
   - a lowpass filter as the lowpass filtering scheme to filter out high frequency signal components from the sampled data streams before decimation to minimize aliasing, reduce noise and reduce other unwanted high frequency components; and
   - a peak detector coupled in parallel with the lowpass filter to capture high frequency events.

4. The digital acquisition system as recited in claim 3 wherein the compressing means further comprises a decimator in parallel with the lowpass filter and the peak detector for selectively discarding data samples from the plurality of sampled data streams.

5. The digital acquisition system as recited in claim 2 wherein the generating means comprises means for further compressing the acquired sample data in generating the waveform images.

6. The digital acquisition system as recited in claim 5 wherein the further compressing means comprises means for averaging a plurality of waveforms from successive acquisitions of the acquired sample data to produce the waveform images.

7. The digital acquisition system as recited in claim 5 wherein the further compressing means comprises means for enveloping a plurality of waveforms from successive acquisitions of the acquired sample data to produce the waveform images.

8. The digital acquisition system as recited in claim 3 wherein the lowpass filter comprises a HiRes filter.

9. The digital acquisition system as recited in claim 3 wherein the lowpass filter comprises a plurality of filter stages in series, each filter stage having a simple lowpass filter design and providing a desired decimation factor.

10. The digital acquisition system as recited in claim 9 wherein the plurality of filter stages comprise:
    a lowpass filter stage having the sampled data streams as an inputs and providing an output, the output being decimated by the desired decimation factor to produce a filtered sampled data stream; and
    an additional filter having the filtered sampled data stream as input and having as an output the compressed sampled data stream with a desired lowpass bandwidth.

11. The digital acquisition system as recited in claim 10 wherein the output of the lowpass filter stage comprises an output selected from the group consisting of a high frequency sampling mode output and a low frequency sampling mode output as the filtered sampled data stream.

12. The digital acquisition system as recited in claim 10 wherein the lowpass filter stage comprises:
    an input register for receiving the sampled data stream; and
    a plurality of layers of filter elements coupled in series with the input register such that the sampled data stream flows through the layers to produce an initial filtered sampled data stream for subsequent decimation.

13. The digital acquisition system as recited in claim 10 wherein the lowpass filter stage comprises a plurality of lowpass filter stages coupled in series, the first filter stage having the sampled data stream as an input and providing a decimated, filtered output, the succeeding filter stages having the decimated, filtered output from an immediately prior filter stage as an input, and the final filter stage having the filtered sampled data stream as an output.

14. The digital acquisition system as recited in claim 10 wherein the additional filter stage comprises a cascaded integrator-comb filter having a plurality of programmable moving average filters in series with the filtered sampled data stream as an input and the compressed sampled data stream as an output.

15. The digital acquisition system as recited in claim 10 wherein the lowpass filter further comprises means for further decimating the compressed sampled data stream to produce the compressed sampled data stream.

16. The digital acquisition system as recited in claim 15 wherein the lowpass filter further comprises means for adjusting the gain of the lowpass filter to be unity at DC before providing the compressed sampled data stream to the storing means.

17. A method of electrical signal acquisition that compresses sampled data prior to storage comprising the steps of:
    digitizing the electrical signal at a high sample rate to produce a sampled data stream;
    compressing the sampled data streams in parallel simultaneously using a plurality of compression schemes, at least one of the compression schemes being a lowpass filtering scheme, to produce a compressed sampled data stream for each compression scheme; and
    storing the compressed sampled data streams as acquired sample data for each compression scheme.

18. The method as recited in claim 17 further comprising the steps of:
    generating a graphic waveform image from the acquired sample data for each compression scheme to produce respective waveform images; and
    displaying the respective waveform images overlaid together so as not to obscure information contained in any of the waveform images.

19. The method as recited in claim 17 wherein the compressing step comprises the steps of:
    lowpass filtering as the lowpass filtering scheme the sampled data stream to filter out high frequency signal components before decimation to minimize aliasing, reduce noise and reduce other unwanted high frequency components; and
    peak detecting the sampled data streams in parallel with the lowpass filtering to capture high frequency events.

20. The method as recited in claim 19 wherein the compressing step further comprises the step of decimating the sampled data stream in parallel with the lowpass filtering and the peak detecting to selectively discard data samples from the sampled data streams.

21. The method as recited in claim 18 wherein the generating step comprises the step of further compressing the acquired sample, data in generating the waveform images.

22. The method as recited in claim 21 wherein the further compressing step comprises the step of averaging a plurality of waveforms from successive acquisitions of the acquired sample data to produce the waveform image.

23. The method as recited in claim 21 wherein the further compressing step comprises the step of enveloping a plurality of waveforms from successive acquisitions of the acquired sample data to produce the waveform image.

24. The method as recited in claim 19 wherein the lowpass filtering comprises the step of filtering using a HiRes filter.

25. The method as recited in claim 19 wherein the lowpass filtering comprises the step of filtering using a plurality of filter stages in series, each filter stage having a simple lowpass filter design and providing a desired decimation factor.

26. The method as recited in claim 25 wherein the plurality of filter stages comprise:
    a lowpass filter stage having the sampled data stream as an input and providing an output, the output being decimated by the desired decimation factor to produce a filtered sampled data stream; and
    an additional filter having the filtered sampled data stream from the lowpass filter stage as input and having as an output the compressed sampled data stream with a desired lowpass bandwidth.

27. The method as recited in claim 26 wherein the output of the lowpass filter comprises an output selected from the group consisting of a high frequency sampling mode output and a low frequency mode output as the filtered sampled data stream.

28. The method as recited in claim 26 wherein the lowpass filter stage comprises a plurality of lowpass filter stages coupled in series, the first filter stage having the sampled data stream as an input and providing a decimated, filtered output, the succeeding filter stages having the decimated, filtered output from an immediately prior filter stage as an input, and the final filter stage having the filtered sampled data stream as an output.

29. The method as recited in claim 26 wherein the additional filter stage comprises a cascaded integrator-comb filter having a plurality of programmable moving average filters in series with the filtered sampled data stream as an input and the compressed sampled data stream as an output.

30. The method as recited in claim 26 wherein the lowpass filtering step further comprises the step of further decimating the compressed sampled data stream to produce the compressed sampled data stream.

31. The method as recited in claim 30 wherein the lowpass filtering step further comprises the step of adjusting the gain of the lowpass filter to be unity at DC before providing the compressed sampled data stream to the storing means.

32. A method of displaying overlaid waveform images derived from a sampled electrical signal comprising the steps of:
    compressing the sampled electrical signal using a peak detect compression scheme to produce a background version of the sampled electrical signal;
    compressing the sampled electrical signal using a decimation/lowpass filtering scheme to produce a foreground version of the sampled electrical signal;
    displaying the foreground version having a default intensity level; and
    displaying the background version having a variable intensity level.

33. The method as recited in claim 32 wherein the background version displaying step comprises the step of displaying pixels of the background version adjacent pixels of the foreground version with reduced intensity, gradually increasing the intensity for the pixels of the background version the further the pixels of the background version are from the pixels of the foreground version.

34. The method as recited in claim 32 wherein the background version displaying step comprises the step of displaying pixels of the background version using a different brightness than that used for displaying pixels of the background version, wherein brightness includes grey scale, hue and/or saturation.

35. The method as recited in claim 32 wherein the background version displaying step comprises the step of adjusting a user control over a first range that varies the intensity of pixels of the background version from zero to a predetermined maximum value.

36. The method as recited in claim 35 wherein the foreground version displaying step comprises the step of adjusting the user control over a second range that varies the intensity of pixels of the foreground version from a default value to a maximum, saturated value.

37. An acquisition system comprising:
    means for acquiring data from an electrical signal;
    means for waveform averaging the data over a plurality of acquisitions by the acquiring means to produce an averaged waveform; and
    means for displaying the averaged waveform overlaid with a waveform derived from the data by another means so as not to obscure information contained in any of the waveforms.

38. The acquisition system as recited in claim 37 wherein the acquiring means comprises:
    means for digitizing the electrical signal at a high sample rate to produce a sampled data stream;
    means for compressing the sampled data stream in parallel simultaneously with a plurality of compression schemes to produce a compressed sampled data stream for each compression scheme; and
    means for storing the compressed sampled data streams for each compression scheme as the data from the acquiring means.

39. The acquisition system as recited in claim 38 further comprising means for further compressing the data from any of the compression schemes to produce the derived waveform.

40. The acquisition system as recited in claim 39 wherein the derived waveform comprises a waveform selected from a group consisting of the data from the plurality of compression schemes.

41. The acquisition system as recited in claim 38 wherein the compression schemes include a lowpass filtering scheme.

* * * * *